United States Patent
Murata et al.

(10) Patent No.: US 7,310,057 B2
(45) Date of Patent: Dec. 18, 2007

(54) LATCH CLOCK GENERATION CIRCUIT AND SERIAL-PARALLEL CONVERSION CIRCUIT

(75) Inventors: Tsutomu Murata, Mizuho (JP); Kosaku Hioki, Ogaki (JP)

(73) Assignee: Sanyo Electric Co., Ltd. (JP)

( * ) Notice: Subject to any disclaimer, the term of this patent is extended or adjusted under 35 U.S.C. 154(b) by 133 days.

(21) Appl. No.: 11/233,459

(22) Filed: Sep. 22, 2005

(65) Prior Publication Data
US 2006/0066356 A1 Mar. 30, 2006

(30) Foreign Application Priority Data
Sep. 30, 2004 (JP) ............................. 2004-285800

(51) Int. Cl.
*H03M 9/00* (2006.01)
(52) U.S. Cl. ...................................... 341/101; 714/731
(58) Field of Classification Search ................ 341/100, 341/101; 714/731, 699; 327/202; 375/354
See application file for complete search history.

(56) References Cited

U.S. PATENT DOCUMENTS

| | | | | |
|---|---|---|---|---|
| 3,612,906 A | * | 10/1971 | Kennedy | 327/155 |
| 5,457,698 A | * | 10/1995 | Segawa et al. | 714/731 |
| 5,572,536 A | * | 11/1996 | Thiruvengadam | 714/732 |
| 6,052,073 A | * | 4/2000 | Carr et al. | 341/100 |
| 6,150,965 A | * | 11/2000 | Carr et al. | 341/101 |
| 6,411,669 B1 | * | 6/2002 | Kim | 377/48 |
| 6,630,853 B1 | * | 10/2003 | Hamada | 327/202 |
| 7,120,214 B2 | * | 10/2006 | Takata | 375/354 |

FOREIGN PATENT DOCUMENTS

| | | |
|---|---|---|
| JP | 5037400 | 2/1993 |
| JP | 2000195287 | 7/2000 |
| JP | 2001075543 | 3/2001 |

* cited by examiner

*Primary Examiner*—Peguy JeanPierre
(74) *Attorney, Agent, or Firm*—Cantor Colburn LLP

(57) ABSTRACT

A serial-parallel conversion circuit in which power consumption is reduced is provided by using a latch clock generation circuit including multiple latch signal generation circuits which outputs a latch signal with a period of an integer multiple of that of a system clock signal. Here, the latch signal generation circuit includes a gate circuit which receives a control signal and a feedback signal, and outputs, according to a combination of the received control signal and feedback signal, a latch signal obtained by inverting a pulse corresponding to one clock of the system clock signal, and an output synchronization circuit which holds the latch signal output from the gate circuit and at the same time outputs the latch signal as a control signal supplied to a gate circuit of a latch signal generation circuit of the succeeding stage and a feedback signal supplied to the gate circuit of the self stage.

8 Claims, 8 Drawing Sheets

LATCH CLOCK GENERATION CIRCUIT AND SERIAL-PARALLEL CONVERSION CIRCUIT

CROSS-REFERENCE TO RELATED APPLICATIONS

The entire disclosures of Japanese Patent Application No. 2004-285800 including specification, claims, drawings, and abstract is incorporated herein by reference.

BACKGROUND OF THE INVENTION

1. Field of the Invention

The present invention relates to a latch clock generation circuit which outputs latch signals sequentially from multiple output terminals thereof in synchronization with a system clock, and a serial-parallel conversion circuit including the latch clock generation circuit.

2. Description of Related Art

Latch clock generation circuits which sequentially varies outputs from multiple output terminals thereof in synchronization with a system clock are today used in a variety of electrical circuits. For example, such latch clock generation circuits are often incorporated into a serial-parallel conversion circuit which simultaneously outputs, as parallel data, serial data received in time series. In such a serial-parallel conversion circuit, the latch clock generation circuit is used to generate a trigger signal to be sent to multiple latch circuits which hold data.

As shown in FIG. 7, a latch clock generation circuit 70 includes multiple latch signal generation circuits 72. The latch signal generation circuits 72 each receive a system clock signal GCLK and output a latch signal LCKn (n being 0 and a positive integer of one or more) in synchronization with the system clock signal.

As shown in FIG. 7, the latch signal generation circuit 72 includes a D-flip-flop (D-FF) 74 and an AND element 76. A control signal Xn−1 from the preceding stage or a line clock signal STP is input to an input terminal D of the D-FF 74. An inverse signal of a system clock signal GCLK is input to a clock terminal C. An output terminal Q of the D-FF 74 is connected to the AND element 76 and an input terminal D of a D-FF 74 included in a latch signal generation circuit 72 of the following stage. The system clock signal GCLK is also input to the AND element 76.

When the control signal Xn−1 supplied to the input terminal D of the D-FP 74 or the line clock signal STP is a high level, a control signal Xn of a high level is outputted from the output terminal Q of the D-FF 74 at a timing when the system clock signal GCLK becomes low level. Consequently, in the AND element 76, a latch signal LCKn is raised to high level when the system clock signal GCLK next becomes high level.

When the control signal Xn−1 or the line clock signal STP is a low level, a signal of a low level is output from the output terminal Q of the D-FF 74 at a timing when the system clock signal GCLK becomes low level. At this time, in the AND element 76, the latch signal LCKn becomes low level independently of the level of the system clock signal GCLK.

FIG. 8 shows a timing chart of the operation of the latch clock generation circuit 70. In FIG. 8, there is shown a timing chart for an example wherein four latch signal generation circuits 72 are provided. The line clock signal STP input to the latch clock generation circuit 70 of the first stage is generated by an external control section (not shown). The line clock signal STP has a period equal to or longer than a time period obtained by multiplying the period of the system clock signal GCLK by the number of the latch signal generation circuits 72. For example, when a number n of the latch signal generation circuits 72 are provided, the period of the line clock signal STP is equal to or longer than n times the period of the system clock signal GCLK. Here, the line clock signal STP has a period equal to the sum of a time period of four times the period A of the system clock signal GCLK and a waiting time T, i.e., a period of 4A+T. In one period, the line clock signal STP is made a high level during a time period corresponding to one clock by being in synchronization with the system clock signal GCLK. This line clock signal STP is input to the input terminal D of the D-FF 74 included in the latch signal generation circuits 72 of the first stage.

When the line clock signal STP becomes high level at time t0, and then the system clock signal GCLK falls to low level at time t1, a high level control signal X0 is output from the output terminal Q of the D-FF 74 of the first stage. When the system clock signal GCLK becomes a high level at time t2, a latch signal LCK0 of high level is output from the AND element 76 of the first stage. The D-FF 74 of the second stage receives the control signal X0 from the D-FF 74 of the first stage. Thus, when the system clock signal GCLK becomes low level at time t3, a control signal X1 of a high level is output from the output terminal Q of the D-FF 74 of the second stage. When the system clock signal GCLK becomes high level at time t4, a latch signal LCK1 of a high level is output from the AND element 76 of the second stage. Similarly, a control signal and latch signal are output from the latch signal generation circuit 72 of the third and fourth stages.

Accordingly, in one period of the line clock signal STP, high level latch signals LCK0, LCK1 . . . are sequentially output from the latch signal generation circuits 72 of the first stage to the final stage in synchronization with the system clock signal GCLK.

As shown in FIG. 7, a serial-parallel conversion circuit includes multiple flip-flop sets 90. Each of the flip-flop sets 90 includes a parallel circuit composed of the same number of D-FFs 92 as the number of bits of a serial transmission line Dn. For example, with a serial transmission line Dn of 18 bits Dn [0] to Dn [17], each of the flip-flop sets 90 includes eighteen D-FFs 92. Data Dn[0] to Dn[17] (data set Dn [0, 17]) transmitted in time series are input to terminals D of each of the D-FFs 92 included in the flip-flop set 90. A latch signal LCKn output from the latch generation circuit 72 of the n-th stage corresponding to each said flip-flop set 90 is input to a clock terminal C of the D-FF 92 included in the flip-flop set 90 of the n-th stage.

Consequently, whenever the latch signals LCK0, LCK1 . . . change to a high level, in order of from the first stage to the final stage, in synchronization with the system clock signal GCLK, data input at that time is held at each of the flip-flop sets 90.

When the serial data Dn [0, 17] are input in synchronization with the system clock signal GCLK, the data Dn [0, 17] can be sequentially held by each flip-flop set 90 and output in synchronization with the system clock signal GCLK. As such, serial data is converted to parallel data.

Also, there has been disclosed a serial-parallel conversion circuit in which data can be captured with a short period and the scales of circuits corresponding to the flip-flop set and latch clock generation circuit are reduced, whereby power consumption is lowered.

Also, there has been disclosed a serial-parallel conversion circuit in which the reduction of power consumption of a latch clock generation circuit is achieved by replacing D-FFs included in the latch clock generation circuit with simple gate circuits.

Further, there has been disclosed a latch signal generation circuit in which a system clock signal is received via a switch. By controlling the opening and closing of the switch, the system clock signal is selectively supplied only to a latch signal generation circuit of that stage which has reached a significant level, whereby the power consumption in the latch signal generation circuit can be reduced.

As described above, the conventional latch clock generation circuit 70 includes a large number of D-FFs 74 and operates in synchronization with the system clock signal GCLK. As the system clock signal GCLK is generally of a high frequency, these multiple latch clock generation circuits 70 consume a great amount of electrical power. Consequently, when a serial-parallel conversion circuit is applied to an LCD controller for a mobile telephone or a digital camera, the power consumption of the latch clock generation circuit can be problematic.

SUMMARY OF THE INVENTION

According to the present invention, there is provided a latch clock generation circuit comprising a plurality of latch signal generation circuits which receive a system clock signal changing with a predetermined period and outputs a latch signal with a period of an integer multiple of that of the system clock signal, the plurality of latch signal generation circuits being connected to each other in series, wherein the latch signal generation circuit includes: a gate circuit which receives a control signal and a feedback signal, and outputs according to a combination of the received control signal and the feedback signal, a latch signal obtained by inverting a pulse corresponding to one clock of the system clock signal; and an output synchronization circuit which holds the latch signal output from the gate circuit and outputs the latch signal as a control signal supplied to a gate circuit of the latch signal generation circuit of the succeeding stage and the feedback signal supplied to the gate circuit of the self stage.

BRIEF DESCRIPTION OF THE DRAWINGS

Preferred embodiments of the present invention will be described in detail based on the following drawings, wherein.

DESCRIPTION OF THE PREFERRED EMBODIMENTS

Figure 1:
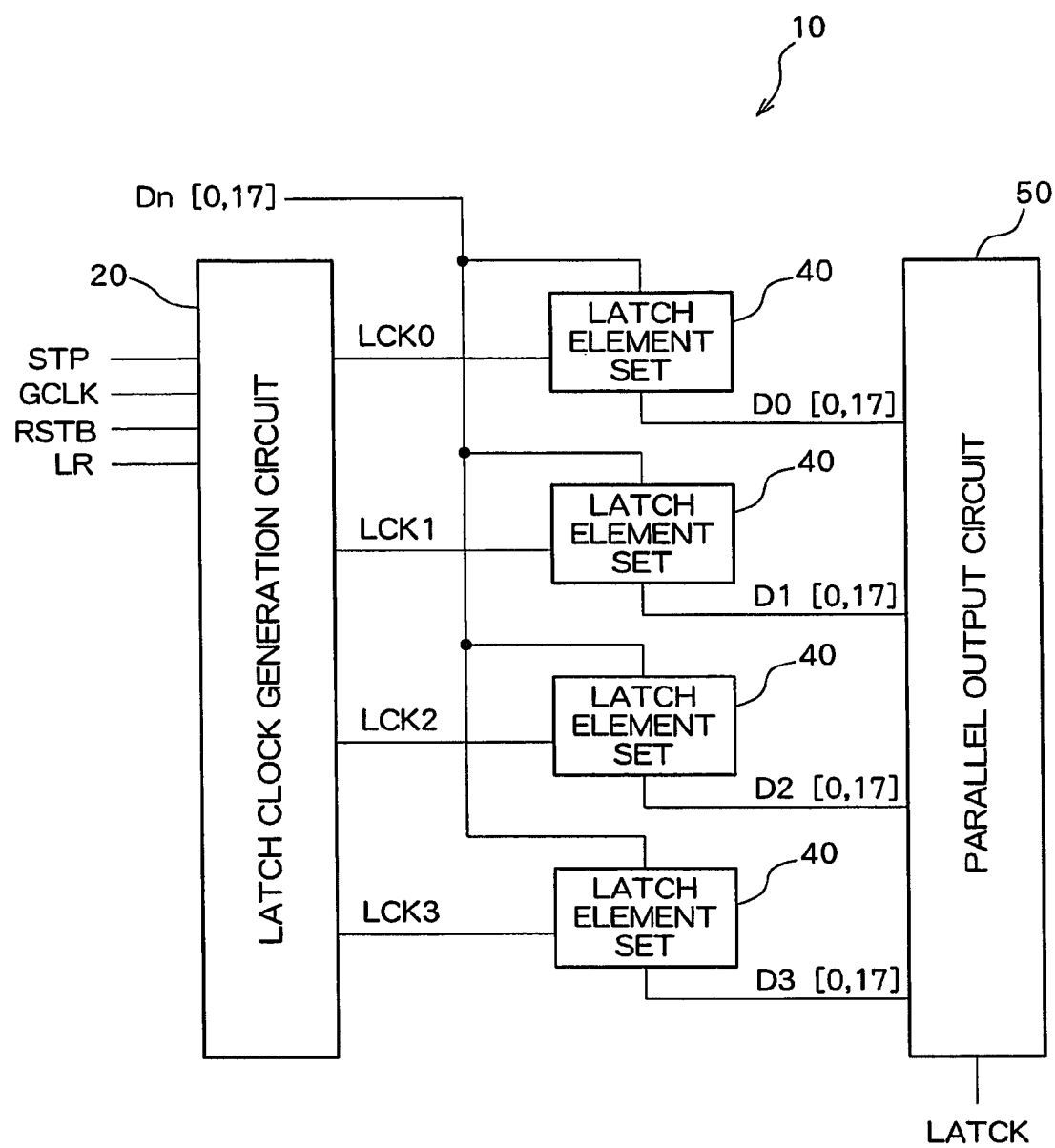
FIG. 1 is a block diagram showing a configuration of a serial-parallel conversion circuit according to a first embodiment of the present invention.

As shown in FIG. 1, a serial-parallel conversion circuit 10 includes a latch clock generation circuit 20, latch element sets 40, and a parallel output circuit 50. In the present embodiment, there will be described a configuration where data transmitted on serial transmission lines of 18 bits Dn [0] to Dn [17] are converted from serial form to parallel form. The serial-parallel conversion circuit 10 receives data Dn [0, 17] transmitted in time series every 18 bits and converts and outputs the data to parallel data of a predetermined number of bits.

Figure 2:
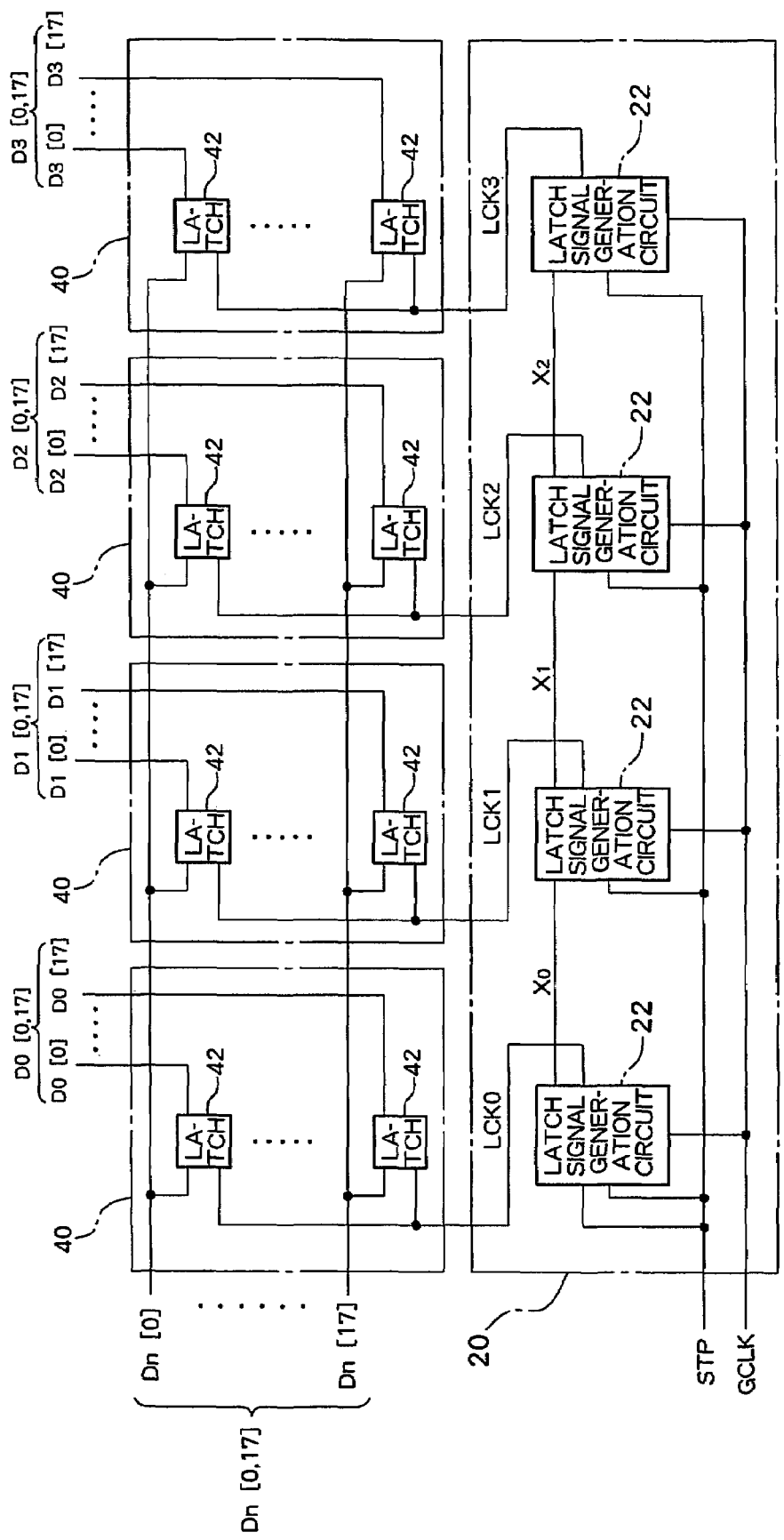
FIG. 2 is a block diagram of an exemplary latch clock generation circuit and latch element set according to the first embodiment of the present invention.

As shown in FIG. 2, the latch clock generation circuit 20 includes a configuration where multiple latch signal generation circuits 22 are connected to each other in series. The latch signal generation circuit 22 works as a gate circuit.

Figure 3:
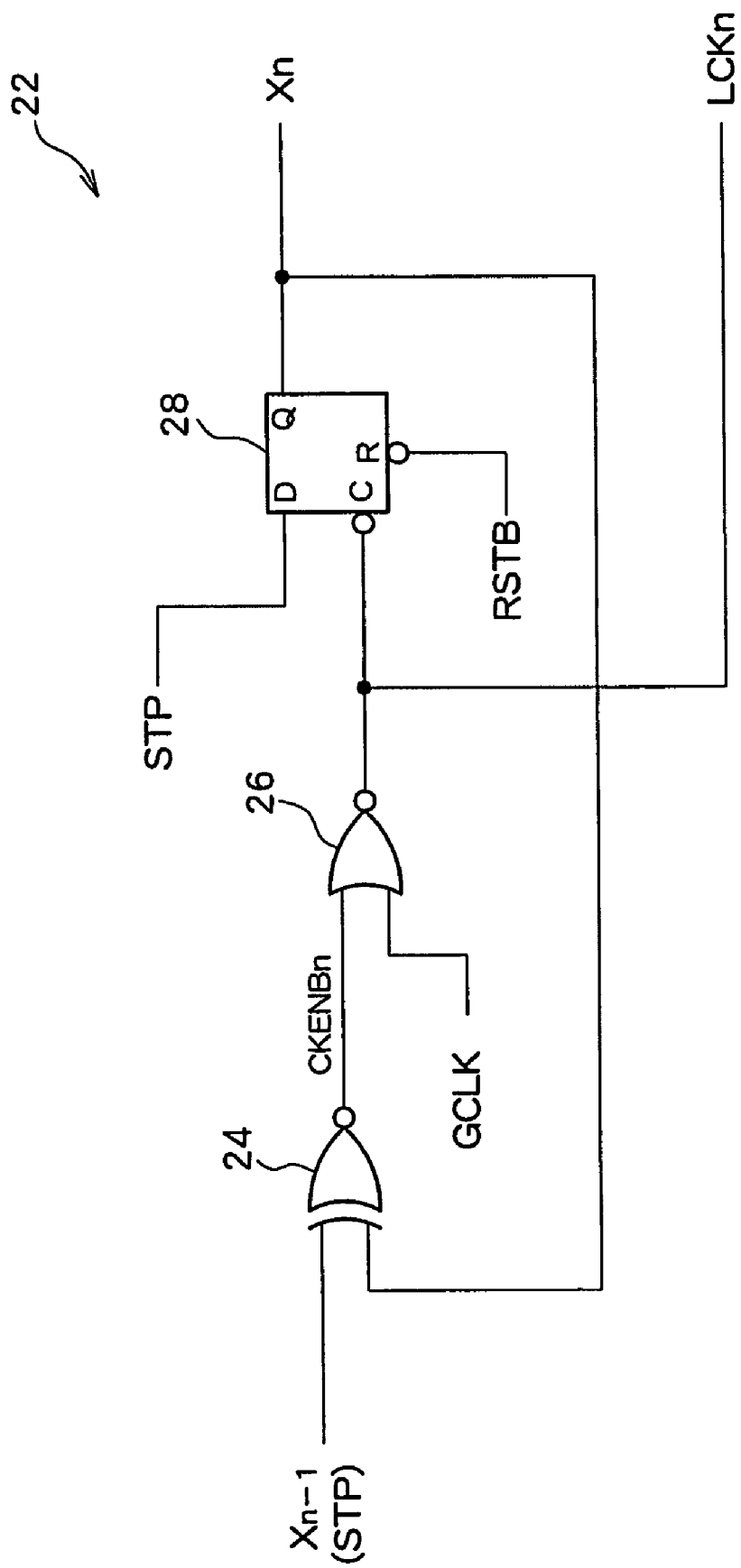
FIG. 3 is a circuit diagram showing an exemplary latch signal generation circuit according to the first embodiment of the present invention.

As shown in FIG. 3, each of the latch signal generation circuits 22 can be constructed by use of an EXNOR element 24, NOR element 26, and D-FF 28. The EXNOR element 24 receives a control signal Xn−1 or line clock signal STP, and an output signal Xn from the D-FF 28, and outputs a gate signal CKENBn. The NOR element 26 receives the gate signal CKENBn from the EXNOR element 24, and a system clock signal GCLK from the outside, and outputs a latch signal LCKn. The latch signal LCKn output from the NOR element 26 is input to the latch element set 40.

The line clock signal STP is input to an input terminal D of the D-FF 28. An inverse signal of the latch signal LCKn output from the NOR element 26 is input to a clock terminal C of the D-FF 28. A control signal Xn is output from a output terminal Q of the D-FF 28. The control signal Xn is input to an EXNOR element 24 of the latch signal generation circuit 22 of the succeeding stage as a control signal X (n+1)−1, and input to the EXNOR element 24 of the self stage as a feedback signal.

The circuit obtained by combining the EXNOR element 24 and NOR element 26 plays a role of a gate circuit controlling the level of the latch signal LCKn.

When the control signals Xn−1 and Xn are the same level, the high level gate signal CKENBn is output from the output terminal of the EXNOR element 24. When the signal CKENBn is high level, the NOR element 26 outputs the low level latch signal LCKn of regardless of the level of the system clock signal GCLK. At this point, regardless of the level of the line clock signal STP, the D-FF 28 holds the previous output level of the control signal Xn, and outputs this level from the output terminal Q.

When the control signals Xn−1 and Xn are a different level, the EXNOR element 24 outputs the low level gate signal CKENBn. When the gate signal CKENBn is a low level, the NOR element 26 outputs an inverse signal of the system clock signal GCLK as the latch signal LCKn. Specifically, when the system clock signal GCLK is high level, the latch signal LCKn is made a low level; the system clock signal GCLK is a low level, the latch signal LCKn is made a high level. Subsequently, at a timing when the latch signal LCKn descends, the D-FF 28 outputs the control signal Xn of the same level as the line clock signal STP from the output terminal Q.

The process of the latch clock generation circuit 20 will now be described with reference to a timing chart of FIG. 4.

A line clock signal STP is input to the input terminal D of the D-FF 28 included in the latch signal generation circuit 22 of the first stage. The line clock signal STP is generated by an external control section (not shown). As shown in FIG. 4, the line clock signal STP has a period equal to or longer than twice a time period obtained by multiplying the period of the system clock signal GCLK by the number of the latch signal generation circuits 22. For example, when there are a number n of the latch signal generation circuits 22 (or the latch element sets 40 corresponding thereto), the period of the line clock signal STP is made equal to or longer than 2n times the period of the system clock signal GCLK. In the present embodiment, because four latch signal generation circuits 22 are provided, the line clock signal STP has a period equal to twice the sum of a time period of four times the period A of the system clock signal GCLK and a waiting time T, i.e., a period of 2*(4A+T). The first half (half period) of the line clock signal STP is made high level; the second half (half period) of the line clock signal STP is made low level.

When the line clock signal STP is low level before time t0. At time t0, the line clock signal STP is made high level in synchronization with the timing at which the system clock signal GCLK becomes low level. At this time, the control signal X0 fed back to the EXNOR element 24 of the latch signal generation circuit 22 of the first stage is low level, so the EXNOR element 24 outputs the gate signal CKENB0 of low level. The NOR element 26 of the latch signal generation circuit 22 of the first stage receives this gate signal CKENB0 and holds the latch signal LCK0 at high level throughout the period when the system clock signal GCLK is at low level.

At time t1, the system clock signal GCLK becomes high level. At the same time, the latch signal LCK0 of the first stage becomes low level. At the timing when the latch signal LCK0 becomes low level, the D-FF 28 of the latch signal generation circuit 22 of the first stage latches the line clock signal STP and outputs the high level control signal X0 from the output terminal Q. The EXNOR element 24 of the latch signal generation circuit 22 of the first stage receives the feedback signal X0 and outputs the high level gate signal CKENB0. The EXNOR element 24 included in the latch signal generation circuit 22 of the second stage receives the high level control signal X0 and the low level control signal X1, and outputs the low level gate signal CKENB1. The NOR element 26 included in the latch signal generation circuit 22 of the second stage receives this gate signal CKENB1, and holds the low level latch signal LCK1 because the system clock signal GCLK is at high level.

At time t2, the system clock signal GCLK becomes low level. In the latch signal generation circuit 22 of the first stage, the gate signal CKENB0 is high level, so the latch signal LCK0 is held at low level. Meanwhile, in the latch signal generation circuit 22 of the second stage, the gate signal CKENB1 is low level, so the latch signal LCK1 becomes high level.

At time t3, the system clock signal GCLK becomes high level. At the same time, the latch signal LCK1 of the second stage becomes low level. At the timing when the latch signal LCK1 becomes low level, the D-FF 28 of the latch signal generation circuit 22 of the second stage latches the line clock signal STP and outputs the high level control signal X1 from the output terminal Q. The EXNOR element 24 of the latch signal generation circuit 22 of the second stage receives the feedback signal X1 and outputs the high level gate signal CKENB1. The EXNOR element 24 included in the latch signal generation circuit 22 of the third stage receives the high level control signal X1 and the low level control signal X2, and outputs the low level gate signal CKENB2.

At time t3 or later, a similar process is performed. The latch signal LCKn is sequentially output from the latch signal generation circuit 22 of the third and subsequent stages.

At time th after a half period of the line clock, the line clock signal STP is made low level in synchronization with a timing when the system clock signal GCLK falls to low level.

At this time, the control signal X0 fed back to the EXNOR element 24 of the latch signal generation circuit 22 of the first stage is high level, so the EXNOR element 24 outputs the gate signal CKENB0 of low level. The NOR element 26 of the first stage receives this gate signal CKENB0 and holds the latch signal LCK0 at high level throughout the period when the system clock signal GCLK is at low level.

As such, similarly as in the first half period of the line clock signal STP, the latch pulse is sequentially output from each of the latch signal generation circuits 22 of the first to final stages.

According to the present embodiment, by using the control signal Xn output from each of the latch signal generation circuits 22 to the succeeding stage as a signal feedbacked to the gate circuit of the self stage, the latch signal LCKn can be returned to low level, independently of the line clock signal STP, by the operation of the gate circuit composed of the EXNOR element 24 and NOR element 26 after a half period of the system clock signal GCLK passes from a time when the latch signal LCKn becomes a high level, whereby the frequency of the line clock signal STP can be lowered, thus making it possible to reduce the overall power consumption of the entire circuit.

Also, according to the present embodiment, the D-FF 28 of the latch signal generation circuit 22 of the n-th stage does not operate through a time period when the latch signal LCKn is held at low level. Thus the power consumption of the latch clock generation circuit 20 can be reduced compared to the conventional art.

Each of the latch element sets 40 is constituted of the same number of the latch elements 42 as the serial transmission line. In the present embodiment, a serial transmission line of 18 bits is taken as an example. Thus, data Dn [0] to Dn [7] (data set Dn [0, 17]) transmitted in time series from the outside are input to the input terminals D of each of the latch elements 42 included in the latch element set 40, respectively. Also, the latch signal LCKn output from the latch signal generation circuit 22 of the n-th stage corresponding to each said latch element set 40 is input to the clock terminal C of each of the latch elements 42 included in the latch element set 40 of the n-th stageinput. The output terminal Q of the latch element 42 is connected to the parallel output circuit 50.

Each of the latch elements 42 included in the latch element set 40 of the n-th stage holds and outputs data input to the output terminal D at a timing when the latch signal LCKn input to the clock terminal C changes to low level. Consequently, whenever the latch signals LCK0, LCK1 . . . change to low level in order of from the first stage to the final stage in synchronization with the system clock signal GCLK, data Dn [0, 17] input at that time are held at each of the latch element sets 40.

When the serial data Dn [0, 17] are input in synchronization with the system clock signal GCLK, the data Dn [0, 17] can be sequentially held by each of the latch element sets 40 and output in synchronization with the system clock signal GCLK. As such, serial data is converted to parallel data.

In FIG. 2, the number of data Dn transmitted in time series is set to 18. However, that number can be varied arbitrarily.

Figure 4:
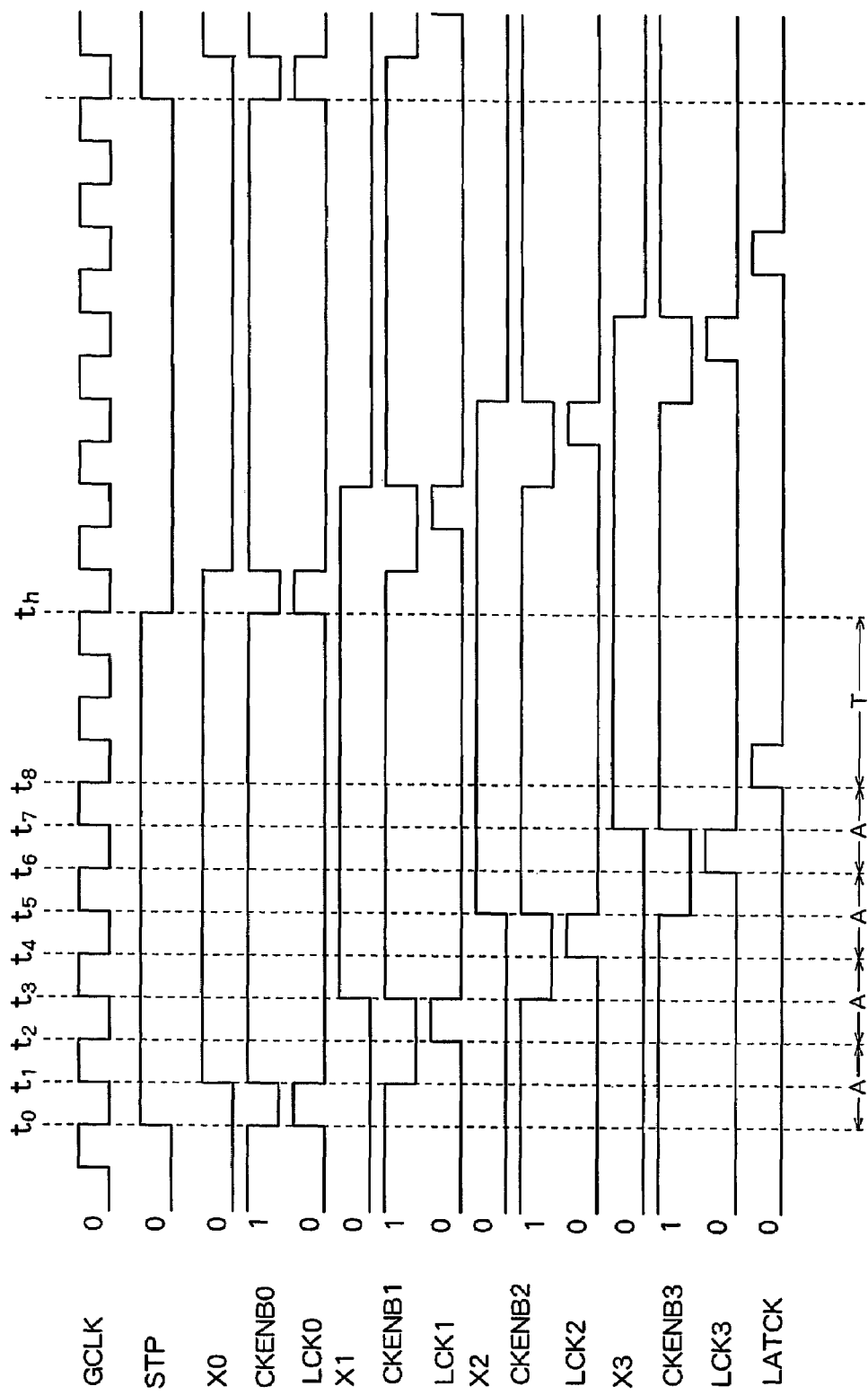
FIG. 4 is a timing chart according to the first embodiment of the present invention.

As shown in the timing chart of FIG. 4, after the latch signal generation circuit 22 of the final stage outputs the high level latch signal LCK3, the parallel output circuit 50 receives a high level parallel output signal LATCK from an external control section. After receiving the parallel output signal LATCK, the parallel output circuit 50 simultaneously outputs the data held in each of the latch elements 42 of each of the latch element sets 40 at a timing when the parallel output signal LATCK is made low level after a half period of the system clock signal STP. For example, by supplying the output of the parallel output circuit 50 to a display driver of a liquid crystal panel or the like, image data with respect to multiple pixels can be simultaneously output to the display driver. As such, the serial-parallel conversion circuit 10 receives serial data transmitted in time series and converts the data to parallel data of a predetermined number of bits before outputting the data.

According to the present embodiment, as a data holding circuit, there is used a latch element which holds data at a timing when a latch signal LCKn becomes low level. With such latch element, the circuit scale can be reduced compared to a D-FF. At the same time, the number of elements can be reduced, so power consumption can also be lowered.

Further, according to the present embodiment, because the section corresponding to the gate circuit has a simple configuration composed of the EXNOR element 24 and NOR element 26, the circuit scale of the latch signal generation circuit 22 can be reduced. Further, the latch element 42 is used as a data holding circuit, whereby with respect to the entire serial-parallel conversion circuit 10, power consumption can be reduced compared to the conventional art, while also reducing the circuit scale.

If the EXNOR element 24 in the latch signal generation circuit 22 as described above is replaced with an EXOR element and the NOR element 26 is replaced with an AND element, a D-FF can be used as a data holding circuit instead of the latch element.

Second Embodiment

In the above described embodiment, the latch signal is sequentially output in order of from the first stage to the final stage. An embodiment that makes it possible to output the stages of the latch signal in reverse order, from the final stage to the first stage, will be now described.

Figure 5:
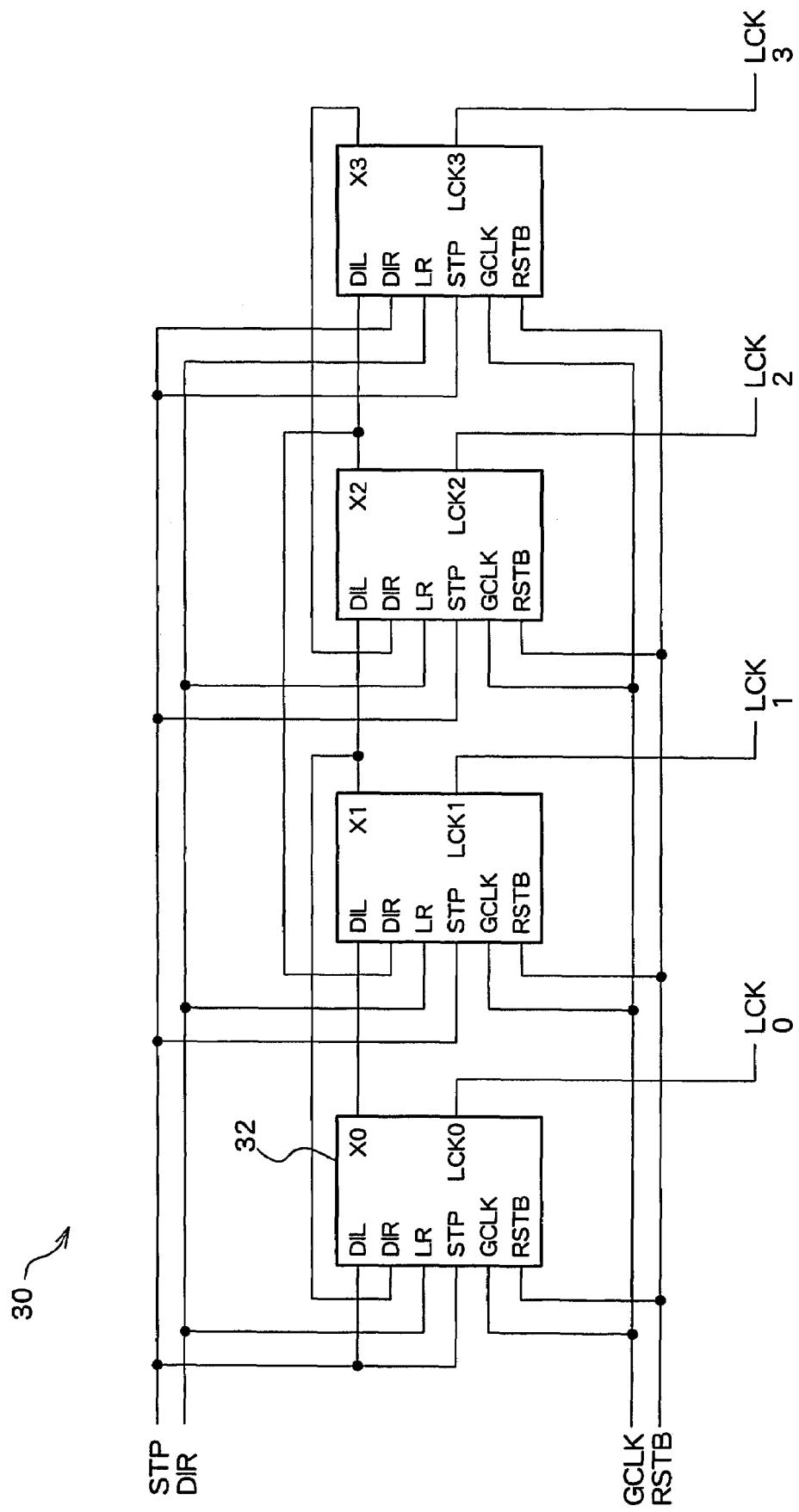
FIG. 5 is a block diagram showing a configuration of a latch clock generation circuit according to a second embodiment of the present invention.
Figure 6:
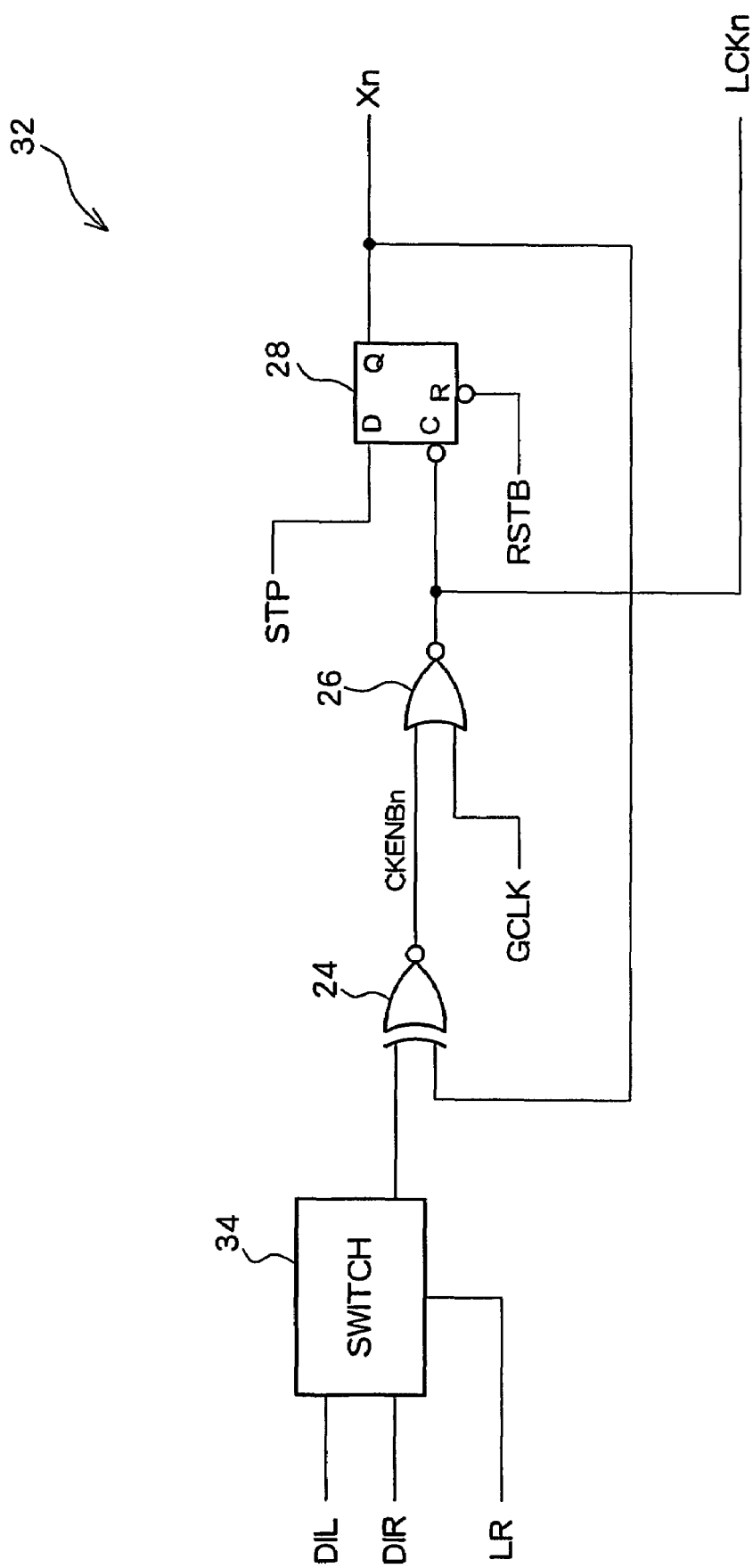
FIG. 6 is a circuit diagram showing an exemplary latch signal generation circuit according to the second embodiment of the present invention.
Figure 7:
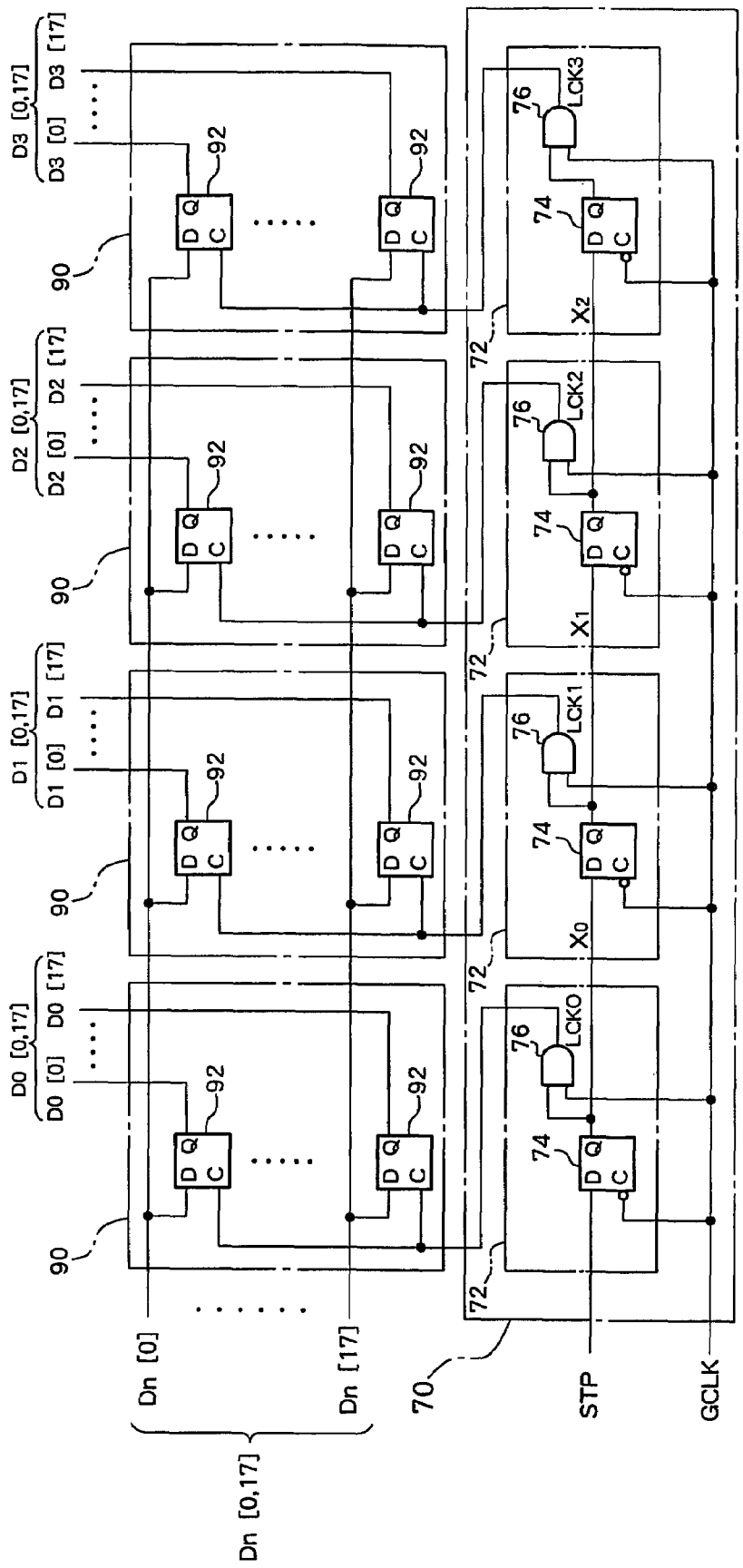
FIG. 7 is a block diagram showing a configuration of a serial-parallel conversion circuit according to a related art.
Figure 8:
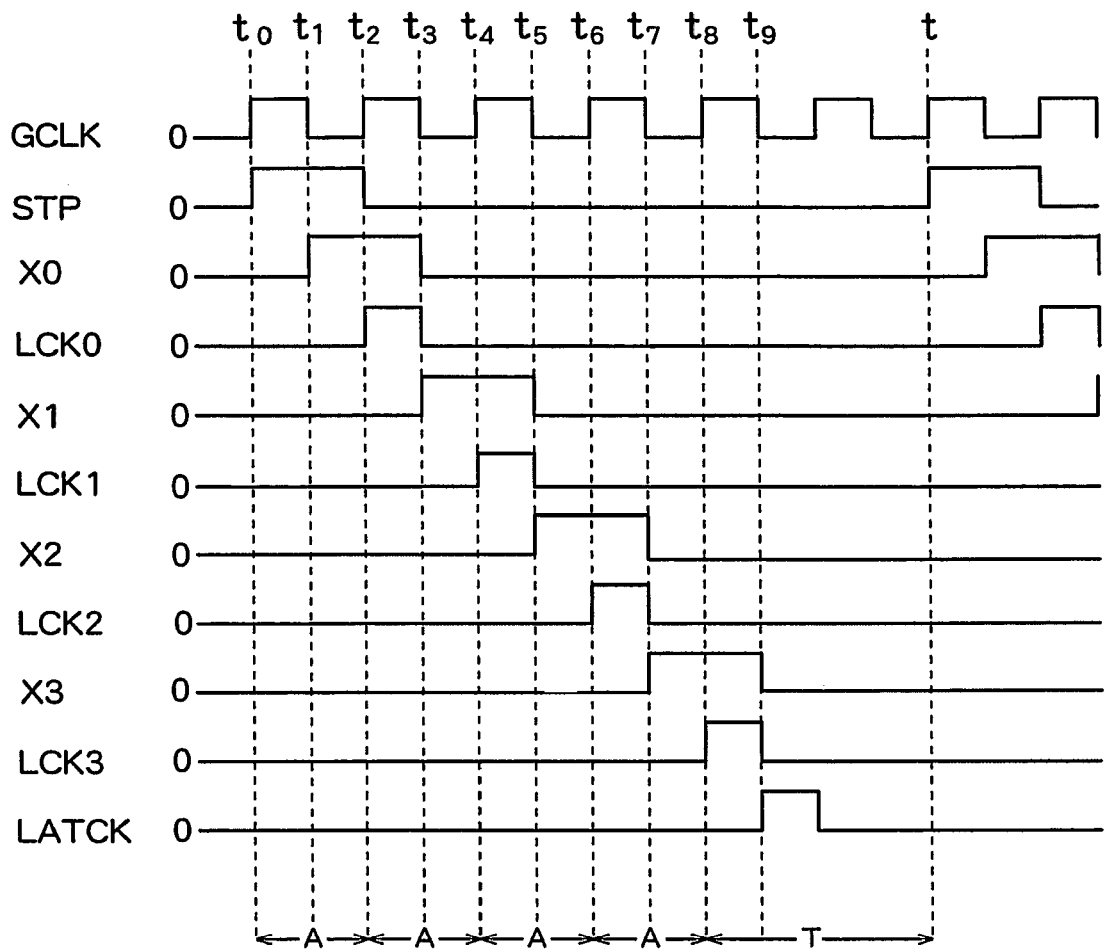
FIG. 8 is a timing chart for a latch clock generation circuit according to the related art.

As shown in FIG. 5, a latch clock generation circuit 30 according to this second embodiment comprises multiple latch signal generation circuits 32 connected to each other in series. As shown in FIG. 6, each of the latch signal generation circuits 32 includes a switch 34, EXNOR element 24, NOR element 26, and D-FF 28. The switch 34, which includes a forward input terminal DIL and backward input terminal DIR, selects one of these input terminals based on a switch signal LR input to a switch terminal LR, and connects the selected terminal to an output terminal.

A control signal Xn−1 from a latch clock generation circuit 30 of the preceding stage is input to the forward input terminal DIL, while a control signal Xn+1 from the latch clock generation circuit 30 of the succeeding stage is input to the backward input terminal DIR. Input to the forward input terminal DIL of the first stage and the backward input terminal DIR of the final stage is a line clock signal STP. The switch signal LR specifying the order of latch output is input to the switch terminal LR. The output terminal of the switch 34 is connected to an input terminal of the EXNOR element 24. The configuration of the EXNOR element 24 and subsequent elements is similar to that of the latch signal generation circuit 22 already described. The output terminal Xn is connected to the forward input terminal DIL of the latch signal generation circuit 32 of the succeeding stage and to the backward input terminal DIR of the latch signal generation circuit 32 of the preceding stage.

The switch 34 receives a switch signal LR. When the switch signal LR is at a high level, the forward input terminal DIL is connected to the EXNOR element 24. When the switch signal LR is at a low level, the backward input terminal DIR is connected to the EXNOR element 24. Accordingly, the switch 34 outputs one of the input signals to the EXNOR element 24. As the operation of the EXNOR element 24 and subsequent elements is similar to that of the already described latch signal generation circuit 22, an explanation thereof will not be repeated. It should be noted that the output signal Xn of the D-FF 28 is output to the forward input terminal DIL of the latch signal generation circuit 32 of the succeeding stage and the backward input terminal DIR of the latch signal generation circuit 32 of the preceding stage, and at the same time output as a feedback signal to the EXNOR element 24 of the latch signal generation circuit 32 including this same D-FF 28.

In the latch clock generation circuit 30, by controlling the switch signal LR, the order of latch output of each of the latch signal generation circuits 32 is controlled. When the switch signal LR is high level, the switch 34 connects the forward input terminal DIL to the EXNOR element 24, so the EXNOR element 24 receives as the control signal, the output signal Xn−1 of the latch signal generation circuit 32 of the preceding stage or the line clock signal STP. Consequently, the latch signal is output sequentially in order of from the preceding stage to the subsequent stage. When the switch signal LR is low level, the switch 34 connects the backward input terminal DIR to the EXNOR element 24, so the EXNOR element 24 receives as the control signal, the output signal Xn+1 of the latch signal generation circuit 32 of the succeeding stage or the line clock signal STP. Consequently, the latch signal is output sequentially in order of from the subsequent stage to the preceding stage.

According to the present embodiment, when the switch signal LR is high level, the high level latch signal LCKn can be output sequentially, in order from the latch signal generation circuit 32 of the first stage to the latch signal generation circuit 32 of the final stage, while, when the switch signal LR is low level, the high level latch signal LCKn can be output sequentially, in order from the latch signal generation circuit 32 of the final stage to the latch signal generation circuit 32 of the first stage.

As described above, according to the embodiments of the present invention, power consumption of the latch clock generation circuit can be reduced compared to the conventional art. Also, the overall power consumption in the entire serial-parallel conversion circuit can also be reduced.

Also, by using a gate circuit, the latch signal output can be shifted a half period relative to the system clock signal, whereby the latch circuit can be used as a data holding circuit. Accordingly, the number of elements can be reduced compared to the conventional configuration in which the data holding circuit is composed of a D-FF 28, whereby power consumption can be reduced.

What is claimed is:

1. A latch clock generation circuit comprising a plurality of latch signal generation circuits which receive a system clock signal changing based on a predetermined period and output a latch signal with a period of an integer multiple of the predetermined period of the system clock signal, the plurality of latch signal generation circuits being connected to each other in series, wherein the latch signal generation circuit includes:
   a gate circuit which receives a control signal and a feedback signal, and outputs according to a combination of the received control signal and the feedback signal, a latch signal obtained by inverting a pulse corresponding to one clock of the system clock signal; and
   an output synchronization circuit which holds the latch signal output from the gate circuit and outputs the latch signal as a control signal supplied to a gate circuit of the latch signal generation circuit of the succeeding stage and the feedback signal supplied to the gate circuit of the self stage.

2. The latch clock generation circuit according to claim 1, wherein the gate circuit includes:
   an EXNOR element which receives a control signal and the feedback signal and outputs a gate signal; and
   an NOR element which receives the system clock signal and the gate signal output from the EXNOR element and outputs a latch pulse at a timing when the system clock signal changes.

3. A serial-parallel conversion circuit including the latch clock generation circuit according to claim 2, the serial-parallel conversion circuit comprising a plurality of latch circuits each including an input terminal to which serial data is input, and each receiving any one of the latch signals output from the plurality of latch signal generation circuits to hold and output the serial data input to the input terminal.

4. The serial-parallel conversion circuit according to claim 3, further comprising a parallel output circuit which receives the outputs from the plurality of latch circuits, and outputs these same outputs all at once in synchronization with an output control signal.

5. The serial-parallel conversion circuit according to claim 3, wherein the serial data input to the input terminal of the latch circuit is updated in synchronization with the system clock signal.

6. A serial-parallel conversion circuit including the latch clock generation circuit according to claim 1, the serial-parallel conversion circuit comprising a plurality of latch circuits each including an input terminal to which serial data is input, and each receiving any one of the latch signals output from the plurality of latch signal generation circuits to hold and output the serial data input to the input terminal.

7. The serial-parallel conversion circuit according to claim 6, further comprising a parallel output circuit which receives the outputs from the plurality of latch circuits, and outputs these same outputs all at once in synchronization with an output control signal.

8. The serial-parallel conversion circuit according to claim 6, wherein the serial data input to the input terminal of the latch circuit is updated in synchronization with the system clock signal.

* * * * *